US012777866B2

(12) United States Patent
Kuo et al.

(10) Patent No.: US 12,777,866 B2
(45) Date of Patent: Oct. 27, 2026

(54) TRIMMING METHOD OF STACKED STRUCTURE BY FORMING A TRENCH

(71) Applicant: Taiwan Semiconductor Manufacturing Company, Ltd., Hsinchu (TW)

(72) Inventors: Sheng-An Kuo, Hsinchu (TW); Eva Wang, Kaohsiung City (TW); Shi-Dong Hong, Hsinchu City (TW); Chen-Sheng Lin, Taoyuan City (TW); Chao-Wen Shih, Hsinchu County (TW); Kuo-Chiang Ting, Hsinchu City (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 377 days.

(21) Appl. No.: 18/516,877

(22) Filed: Nov. 21, 2023

(65) Prior Publication Data

US 2025/0167150 A1 May 22, 2025

(51) Int. Cl.

| | |
|---|---|
| ***H10P 52/00*** | (2026.01) |
| ***H10W 74/01*** | (2026.01) |
| ***H10W 74/10*** | (2026.01) |
| ***H10W 80/00*** | (2026.01) |
| ***H10W 90/00*** | (2026.01) |

(52) U.S. Cl.

CPC ........... *H10P 52/00* (2026.01); *H10W 74/019* (2026.01); *H10W 74/141* (2026.01); *H10W 80/312* (2026.01); *H10W 80/327* (2026.01); *H10W 90/792* (2026.01)

(58) Field of Classification Search

CPC ...... H10P 52/00; H10P 72/74; H10W 74/019; H10W 74/141; H10W 80/312; H10W 80/327; H10W 90/792

See application file for complete search history.

(56) References Cited

U.S. PATENT DOCUMENTS 8,551,881 B2 * 10/2013 Shih ........................ H10P 52/00 438/459
10,833,053 B1 * 11/2020 Chen ........................ H10P 72/74
10,867,928 B2 * 12/2020 Lu ........................ H10W 70/614
10,867,963 B2 * 12/2020 Hsu ..................... H01L 25/0652
10,923,421 B2 * 2/2021 Chen ........................ H10P 72/74
11,387,207 B2 * 7/2022 Huang ................ H10W 72/073

(Continued)

*Primary Examiner* — Caleb E Henry

(74) *Attorney, Agent, or Firm* — JCIPRNET

(57) ABSTRACT

A first wafer having a first portion closer to a first surface and a thicker second portion connected with the first portion and closer to the second surface opposite to the first surface is provided. A second wafer is provided to bond with the first wafer. An edge trimming process is performed to form a trench penetrating through the second wafer and extending beyond the first portion and extending into the second portion. After bonding dies to the second wafer, a filling material is formed over the dies and the first and second wafers, wrapping around and between the dies, covering the first and second wafers, and partially filling the trench. A wafer thinning process is performed to remove the second portion and partially remove the filling material in the trench to level the surface of the thinned first wafer with the surface of the thinned filling material.

20 Claims, 17 Drawing Sheets

(56) References Cited

U.S. PATENT DOCUMENTS

| | | | | |
|---|---|---|---|---|
| 2012/0270394 | A1* | 10/2012 | Shih | H10P 52/00<br>438/667 |
| 2017/0110496 | A1* | 4/2017 | Lin | H10F 39/809 |
| 2017/0229322 | A1* | 8/2017 | Hsu | H10W 74/019 |
| 2019/0295972 | A1* | 9/2019 | Tsai | H10D 1/20 |
| 2020/0402942 | A1* | 12/2020 | Chen | H10W 70/60 |
| 2021/0134663 | A1* | 5/2021 | Huang | H10W 20/023 |
| 2021/0134694 | A1* | 5/2021 | Li | H10W 20/023 |
| 2022/0375789 | A1* | 11/2022 | Huang | H10W 20/077 |
| 2024/0170299 | A1* | 5/2024 | Li | H10P 14/68 |

* cited by examiner

TRIMMING METHOD OF STACKED STRUCTURE BY FORMING A TRENCH

BACKGROUND

Following the trend in miniaturizing the semiconductor chips, higher criterion is needed for the wafer thinning process commonly practiced in the semiconductor manufacturing processes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
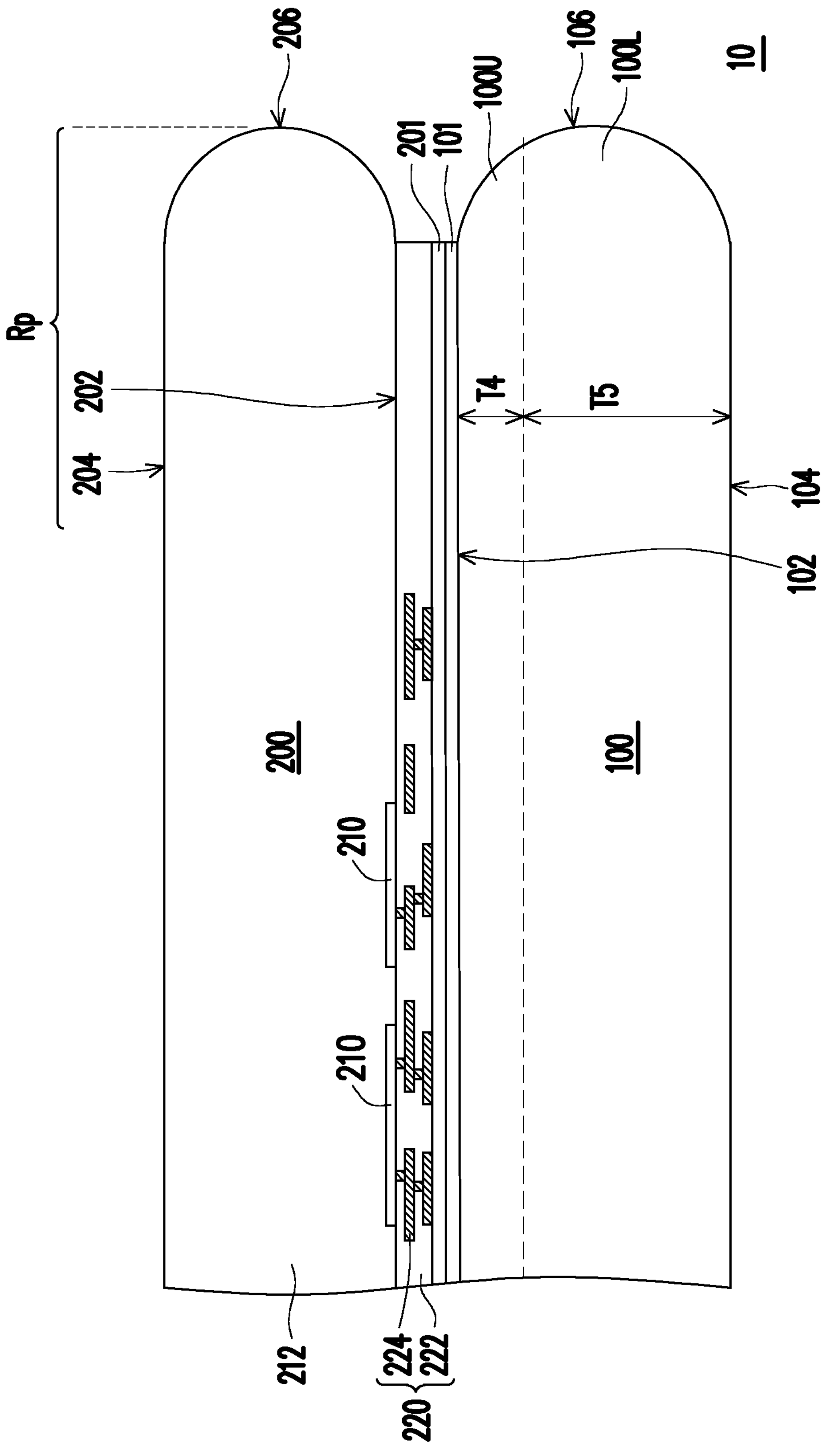
FIGS. 1-16 illustrate schematic cross-sectional views of various stages of a trimming method of a stacked wafer structure, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1-16 illustrate schematic views of various stages of a trimming method of a stacked wafer structure, in accordance with some embodiments of the present disclosure.

Referring to FIG. 1, a first wafer 100 is provided. In some embodiments, the first wafer 100 has a top surface 102, a bottom surface 104 opposite to the top surface 102, and an edge surface 106 connecting the top surface 102 and the bottom surface 104. In some embodiments, the first wafer 100 includes an upper portion 100U of a thickness T4 closer to the contact side (the side where the top surface 102 is located) and a lower portion 100L of a thickness T5 closer to the other side (the side where the bottom surface 104 is located). The first wafer 100 functions as a carrier wafer and may be of any appropriate size and shape. In some embodiments, the first wafer 100 is or includes a semiconductor bulk wafer. For example, the first wafer 100 is a wafer of a round or oval shape. In some embodiments, a bonding layer 101 is provided on the top surface 102 of the first wafer 100. In some embodiments, the bonding layer 101 is an oxide layer or includes a silicon oxide layer.

Referring to FIG. 1, a second wafer 200 having one ore more device layers 210 embedded in the substrate body 212 is provided and bonded to the first wafer 100. In some embodiments, the second wafer 200 has a first surface 202 and a second surface 204 opposite to the first surface 202, and an edge surface 206 connecting the first surface 202 and the second surface 204. In some embodiments, the second wafer 200 includes an interconnection structure 220 formed on the first surface 202 and a bonding layer 201 formed on the interconnection structure 220. In some embodiments, the second wafer 200 is a substantially circular semiconductor wafer.

As seen in FIG. 1, in some other embodiments, after mounting the second wafer 200 onto the first wafer 100, a thermal annealing process is performed to bond the first and second wafers 100, 200 to form a stacked wafer structure 10. In some embodiments, the first wafer 100 and the second wafer 200 are bonded though bonding layers 101 and 201 at the bonding interface of the first wafer 100 and the second wafer 200 after bringing the bonding layers 101 and 201 of the first and second wafers 100 and 200 into contact. In some embodiments, after bringing the first and second wafers 100 and 200 into contact, the thermal annealing process is performed to strengthen the bonding between the first wafer 100 and the second wafer 200. In some embodiments, the thermal annealing process is performed at temperature ranging from about 100 Celsius degree to about 250 Celsius degree to bond the bonding layers 101, 201 (via dielectric-dielectric bonding) of the first and second wafers 100, 200 into a stacked wafer structure 10.

As the device layer 210 is located closer to the contact side (the side where the first surface 202 is located), the first surface 202 may be referred to the frontside surface of the second wafer 200, and the opposite surface 204 may be referred to the backside surface of the second wafer 200. In some embodiments, the edge surfaces 106 and 206 in FIG. 1 are illustrated as curved surfaces or rounded edges. In other embodiments, the first wafer 100 or the second wafer 200 may have a chamfered edge or a beveled edge.

In some embodiments, the first wafer 100 is a semiconductor wafer such as a silicon bulk wafer or a gallium arsenide wafer. In some embodiments, the second wafer 200 is a semiconductor wafer made of a semiconductor material including silicon, strained silicon, silicon alloy, silicon carbide, silicon-germanium, silicon-germanium carbide, germanium, germanium alloys, germanium arsenide, or group III-V semiconductors (e.g. gallium arsenide, gallium nitride, indium arsenide, etc.). In some embodiments, the second wafer 200 is or includes a silicon bulk wafer, a silicon-on-insulator (SOI) wafer or a gallium arsenide wafer. In some embodiments, the second wafer 200 is a device wafer including a plurality of devices formed within the device layer 210.

In some embodiments, the devices formed within the device layer 210 may include, for example, active devices (e.g., transistors, diodes, silicon-controlled rectifiers, generators, or the like) and optionally passive devices (e.g., resistors, capacitors, inductors, transducers, transformers or the like), or image sensors capable of converting light to electrical signals formed therein. In certain embodiments, the devices formed in the device layer 210 may include, for example, transistors. In some embodiments, the device layer(s) 210 is located relatively distanced from the edge surface 206 and located outside the peripheral region Rp of the second wafer 200, such that the following trimming processes may be carried out without damaging the device layer(s) 210 or the devices therein. In some embodiments, additional semiconductor devices or electrical components with different functions or integrated circuits may also be included in the second wafer 200. In some embodiments, the interconnection structure 220 formed over the first surface 202 of the second wafer 200 is electrically connected with the device layer(s) 210 and is electrically coupled with the devices and/or other electrical components formed within the device layer(s) 210. The scope of the disclosure is not limited to the embodiments or drawings described therein.

In some embodiments, the interconnection structure 220 includes dielectric layers 222 and conductive patterns 224 alternately stacked. The conductive patterns 224 include routing traces extend horizontally in between consecutively stacked dielectric layers 222 and vias vertically penetrating through the dielectric layers 222 to establish electrical connection between the above and underlying routing traces and to the device layer(s) 210. In some embodiments, the interconnection structure 220 provides redistributing functions for routing, relocating or redistribution the electrical connection paths for the devices of the device layers 210.

Figure 2:
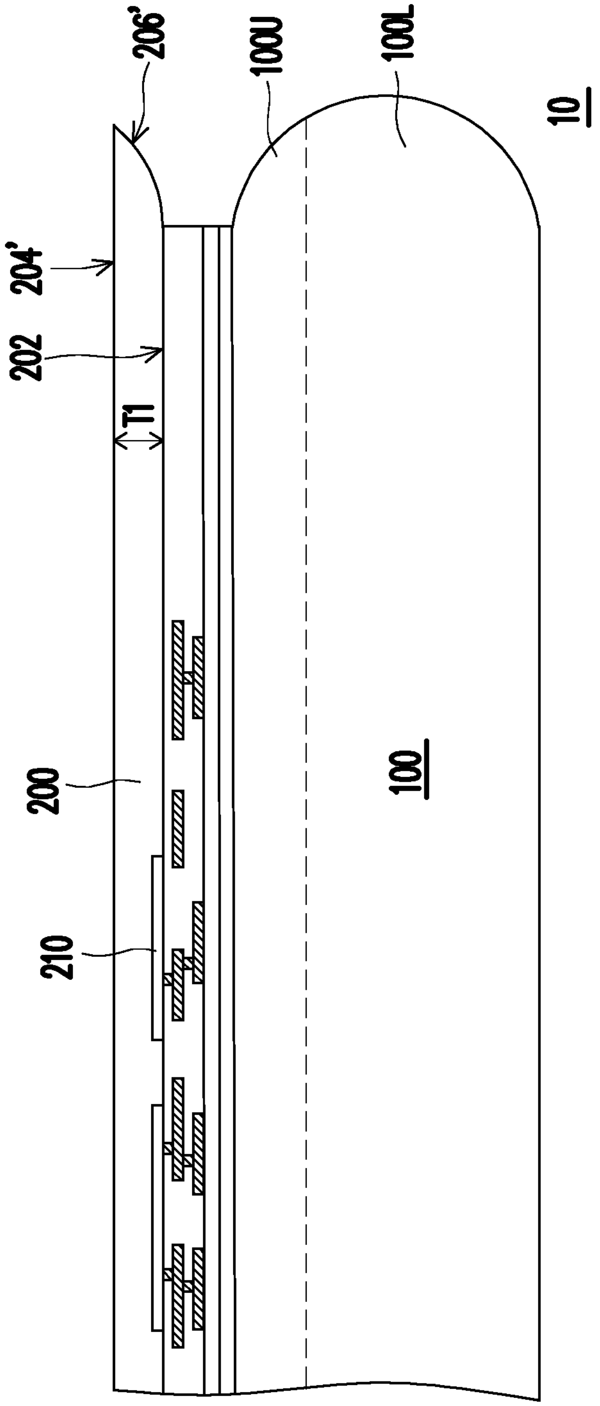

Referring to FIG. 2, the second wafer 200 is thinned (i.e. the thickness of the second wafer 200 is reduced) from the backside surface 204 by performing a wafer thinning process. In some embodiments, the thinning process includes performing a mechanical machining process, and the mechanical machining process includes, for example, a grinding process, a chemical mechanical polishing (CMP) process, or other suitable polishing process. In some embodiments, the second wafer 200 is thinned by partially removing the substrate body 212 from the second surface 204 downward towards the first surface 202, and the thinned second wafer 200 has a remained thickness T1 (measuring from the treated surface 204' to the first surface 202 along the thickness direction or stacking direction). During performing the thinning process, the stacked wafer structure 10 may be hold by a chuck or holder (not illustrated), and the second wafer 200 is thinned down to the thickness T1 without exposing the device layer(s) 210. In some embodiments, the second wafer 200 is thinned until the remained thickness T1 almost equals to or approaches the preset thickness value. As seen in FIG. 2, after the thinning process, the edge(s) 206' of the second wafer 200 is rather sharp and fragile.

Figure 3:
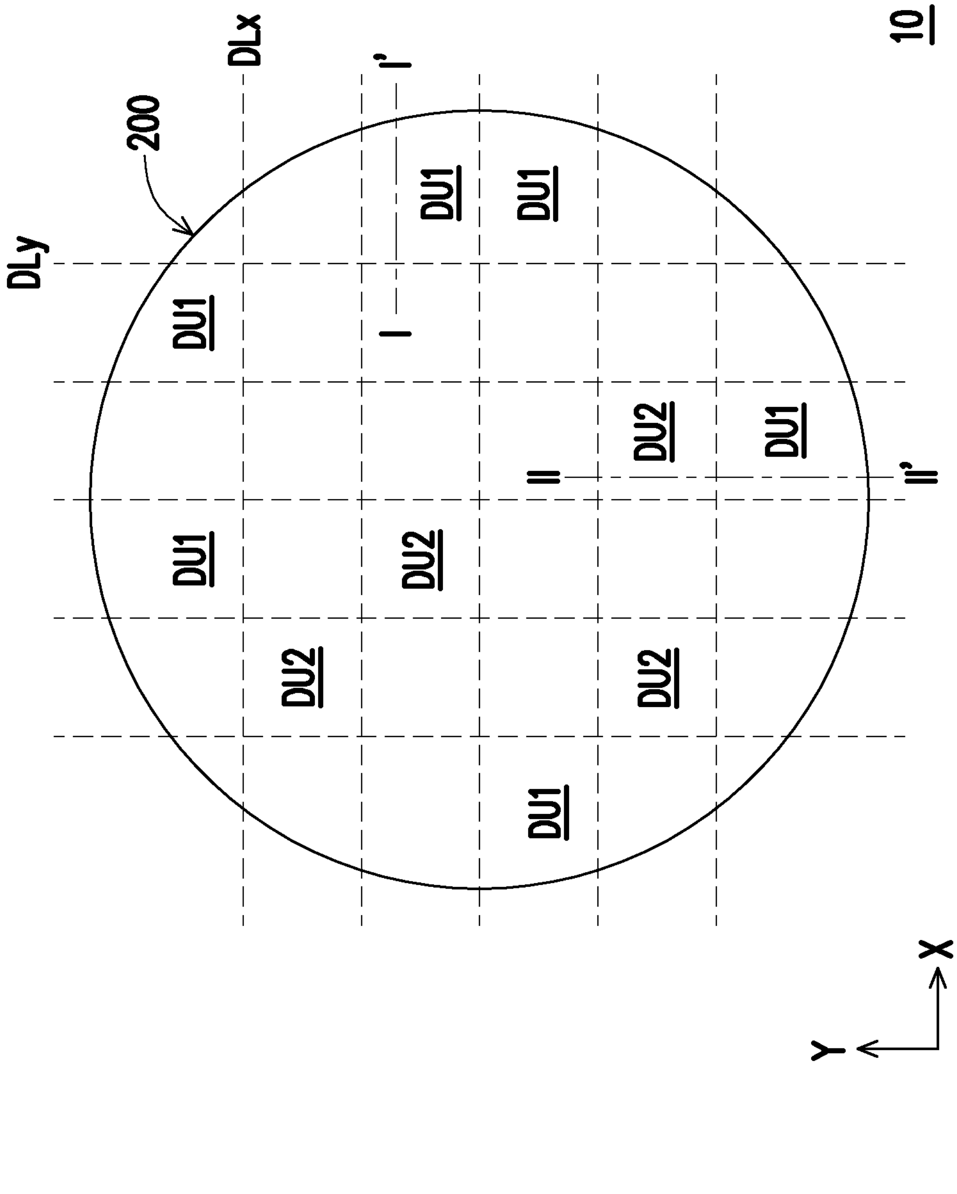

FIG. 3 illustrates a schematic top view of the stacked wafer structure 10 after performing the thinning process to the second wafer 200, in accordance with some embodiments of the present disclosure. From the schematic top view of FIG. 3, only the second wafer 200 is shown as the first wafer 100 is shielded and covered by the second wafer 200. In some embodiments, it is seen that the stacked wafer structure 10 includes multiple die units defined by the dicing lanes DLx (extending in the X-direction) and DLy (extending in the Y-direction). As seen in FIG. 3, at least two types of die units, outer die units DU1 and inner die units DU2, are defined by the dicing lanes. Referring to FIG. 3, the schematic cross-sectional views of FIG. 1 and FIG. 2 may refer to certain portions of the stacked wafer structure 10 along the cross-sectional line I-I'.

Figure 4:
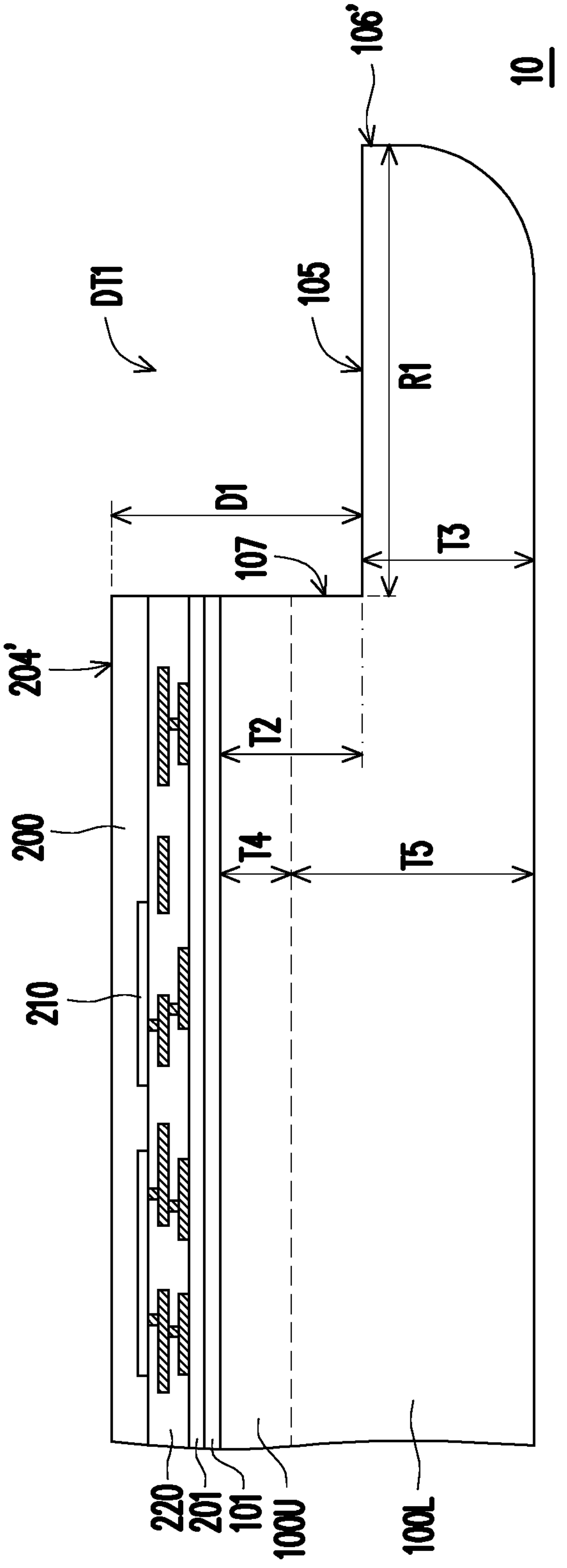

Following the wafer thinning process of FIG. 2 and FIG. 3, referring to FIG. 4, an edge trimming process is performed to the stacked wafer structure 10. During the wafer thinning process, the mechanical grinding process or polishing process performed on the backside surface of the semiconductor wafer may cause the wafer edge(s) to be breakable or easily damaged. In some embodiments, the edge trimming process performed to remove the outer edges (the border) of the stacked wafer structure 10. In some embodiments, the edge trimming process not only removes the peripheral region Rp of the second wafer 200 but also cuts through the interconnection structure 220 and cuts into the first wafer 100. As the sharp and fragile edges 206' of the wafer 200 are removed during the edge trimming process, the risks of edge-cracking due to sharp edges of the thinned second wafer 200 can be mitigated.

In some embodiments, the edge trimming process includes cutting or trimming off a portion of the stacked wafer structure 10 by mechanical machining from the surface 204' vertically downward (i.e. towards the first surface 202 but not cutting through) along the thickness direction to form the trimmed edge 106' at the periphery of the first wafer 100 as shown in FIG. 4. In some embodiments, the edge trimming process is performed from the surface 204' cutting through the second wafer 200 and cutting substantially vertically into the first wafer 100 to a trimming depth D1. In certain embodiments, during the edge trimming process, the first wafer 100 is cut downward beyond the upper portion 100U but cutting into the lower portion 100L. In some embodiments, the edge trimming process includes a grinding process performed by a trimming tool such as a grinding wheel or a trimming blade wheel. It is appreciated that the profile of the trench or opening may vary depending on the types of the trimming tool used. Alternatively, the edge trimming process is performed through any other suitable tools capable of mechanically cutting away the material of the wafer structure, and the scope of the disclosure is not limited thereto.

Figure 5:
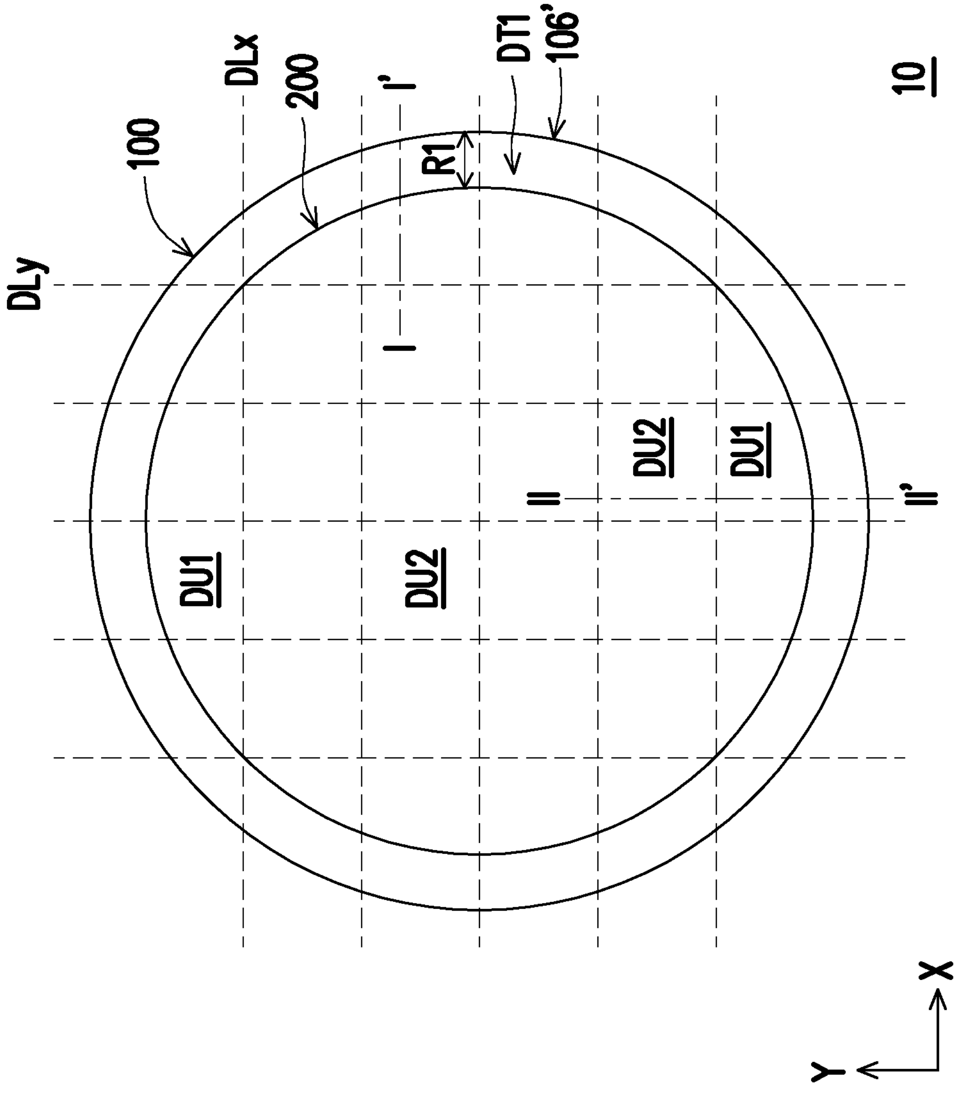
Figure 6:
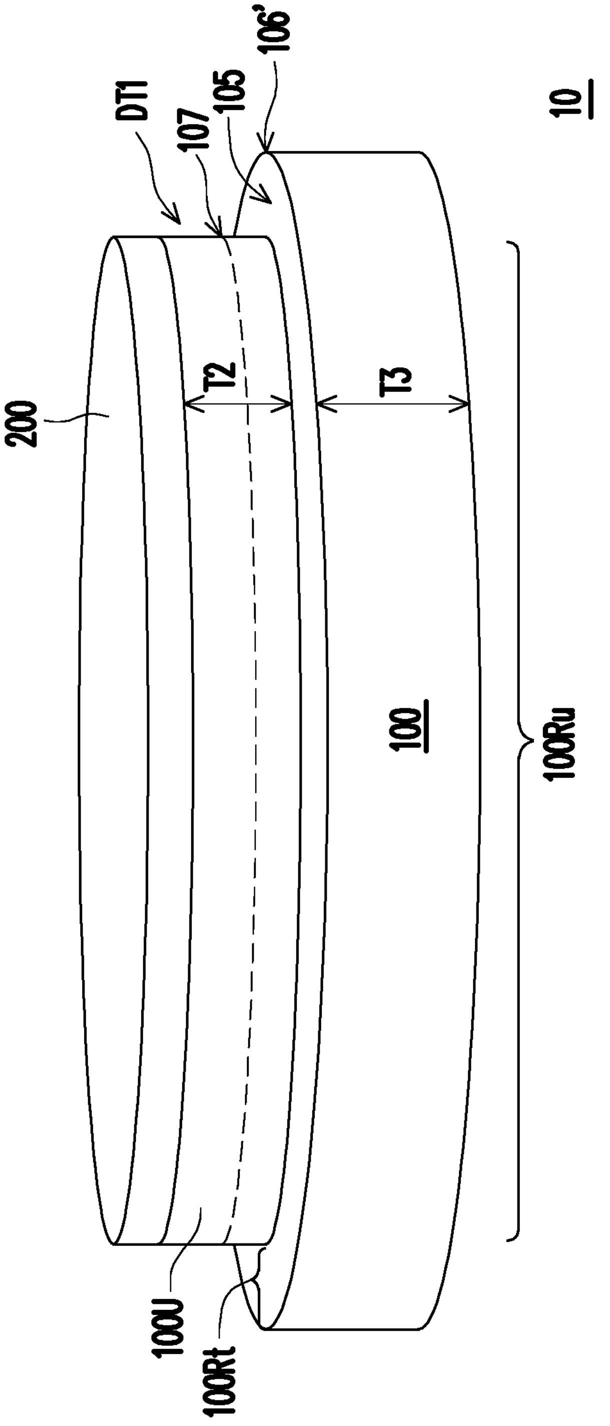

FIG. 5 illustrates a schematic top view of the stacked wafer structure 10 after performing the edge trimming process, in accordance with some embodiments of the present disclosure. FIG. 6 illustrates a schematic three-dimensional (3D) view of the stacked wafer structure 10 after performing the edge trimming process, in accordance with some embodiments of the present disclosure.

In some embodiments, it is seen that the stacked wafer structure 10 includes the outer die units DU1 and the inner die units DU2 defined by the dicing lanes DLx (extending in the X-direction) and DLy (extending in the Y-direction). As seen in FIG. 5, the outer die units DU1 are located in a bordering region of the second wafer 200, surrounding the inner die units DU2 located in the inner mid region of the second wafer 200. In some embodiments, in FIG. 5, considering the inner die unit in a quadrilateral or four-sided shape, the inner die units DU2 are connected with one another and each inner die unit DU2 is side-to-side connected with four die units (either DU2 or DU1). In some embodiments, as seen in FIG. 5, each outer die units DU1 is side-to-side connected with one inner die unit DU2 and further connected to one or two outer die units DU1.

Referring to FIGS. 4, 5 and 6, in some embodiments, taking the stacked wafer structure 10 being round shaped as the example, the trimming tool is moved along the circular path along the periphery of the stacked wafer structure 10, a ring-shaped trench DT1 is formed by removing the peripheral region Rp of the second wafer 200 and removing border portions of the interconnection structure 220 and the bonding layers 101, 201 and the peripheral portion of the first wafer 100 right below the peripheral region Rp of the second wafer 200. In some embodiments, the trench DT1 is formed as a continuous trench encircling the periphery or border of the stack wafer structure 10. Referring to FIG. 4, in some embodiments, the trench DT1 has a trimming depth D1 (measuring from the surface 204' to the bottom surface 105 of the trench DT1) and a width R1 (measuring from the cut edge 106' of the first wafer 100 to the sidewall 107 of the trench DT1). In some embodiments, the sidewall 107 is substantially perpendicular to the bottom surface 105 of the trench DT1. In some embodiments, it is possible that the sidewall 107 is slant to the bottom surface 105. In fact, the sidewall 107 of the trench DT1 includes the sidewall 200S of the second wafer 200, the sidewall of the interconnection structure 220, the sidewalls of the bonding layers 101, 201 and the trimmed sidewall 100TS of the first wafer 100, and it is referred to as the sidewall 107 for simplicity.

In some embodiments, the stacked wafer structure 10 is in a round wafer form having a diameter of about 12-inch or 14-inch. In such embodiments, the trimming depth D1 ranges from about 100 microns to about 200 microns. In some embodiments, the trimming depth D1 ranges from about 120 microns to about 170 microns. In some embodiments, the trimming width R1 ranges from about 1.0 mm to about 5 mm. In some embodiments, the trimming width R1 is about 3 mm. It is appreciated that the trimming depth and/or the trimming width may be modified depending on the dimension of the wafer and the design requirements of the product, which is not limited thereto. In the embodiments of the present disclosure, through the edge trimming process, the first wafer 100 is cut downward with a depth D1, cutting beyond the upper portion 100U but cutting into the lower portion 100L.

From the schematic top view of FIG. 5, the ring-shaped trench DT1 is recessed from the edge 106' with the retreated width R1. Even the peripheral portion Rp of the second wafer 200 is removed, the device layers 210 of the second wafer 200 are remained without being damaged. Referring to FIG. 4 and FIG. 6, by removing the peripheral region Rp of the second wafer 200 and removing border portions of the interconnection structure 220 and the bonding layers 101, 201 and the peripheral portion of the first wafer 100, the trench DT1 is formed by cutting into the first wafer 100 to a depth (over-trim depth) T2, and the trimmed and remained portion 100Rt of the first wafer 100 has a remained thickness T3. That is, for the untrimmed portion 100Ru (i.e. in the original state) of the first wafer 100, the total thickness is (T2+T3). As seen from FIG. 4, the trimming depth D1 and the over-trim depth T2 of the trench DT1 are both larger than the thickness T4 of the upper portion 100U of the first wafer 100. Also, the over-trim depth T2 is smaller than the remained thickness T3, and the ratio of T2/T3 ranges from about 0.15 to about 0.28. In other words, the edge trimming process performed in the trimming method of the present disclosure is an over-cut edge trimming process.

When the over-trim depth T2 is larger than the thickness T4 of the upper portion 100U, through the edge trimming process, the upper portion 100U that is directly below the peripheral region Rp of the second wafer 200 is removed by the edge trimming process, which further improves the robustness of the stacked wafer structure in later processes and the yield of the stacked die structure.

Figure 7:
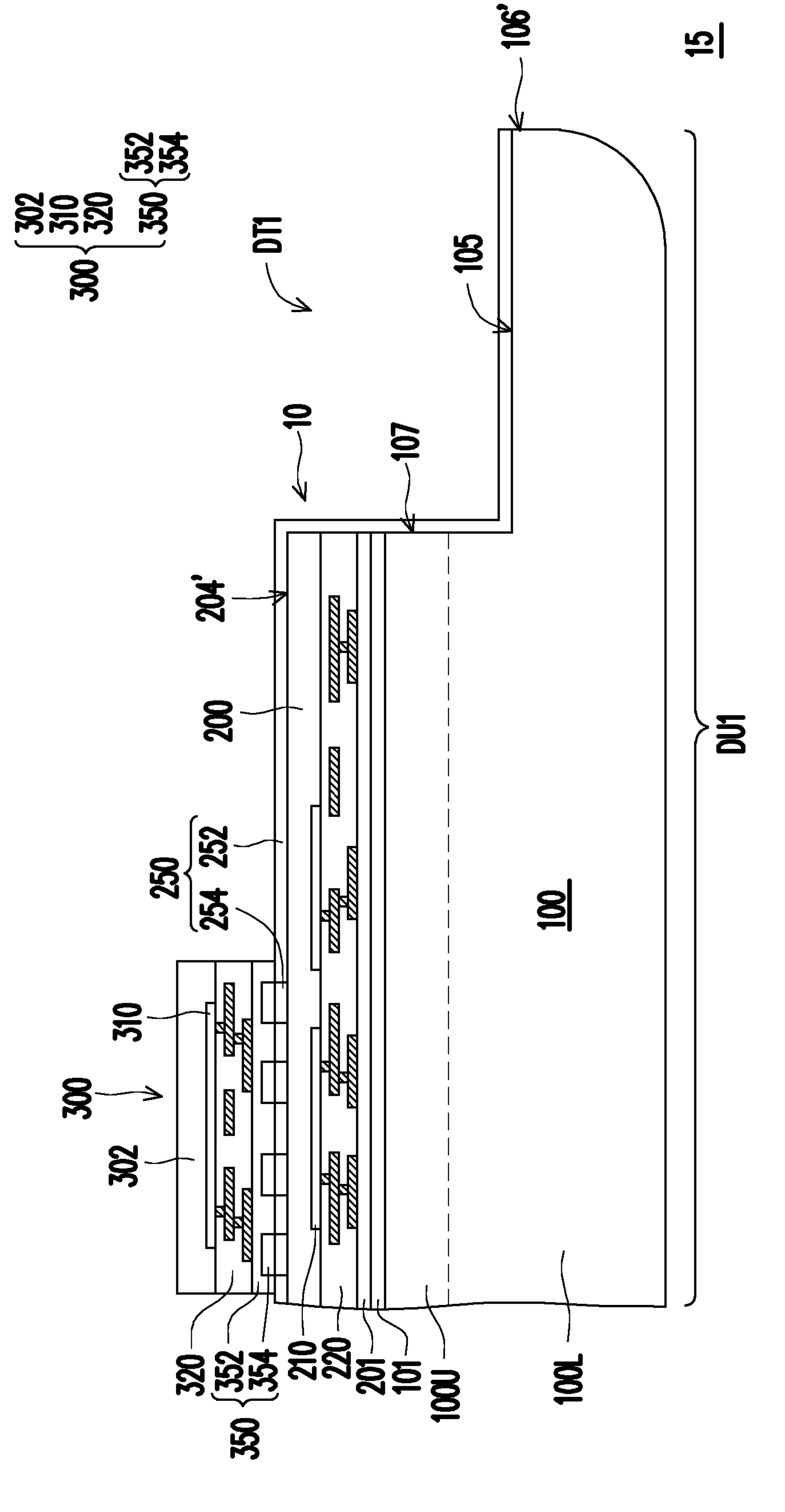
Figure 8:
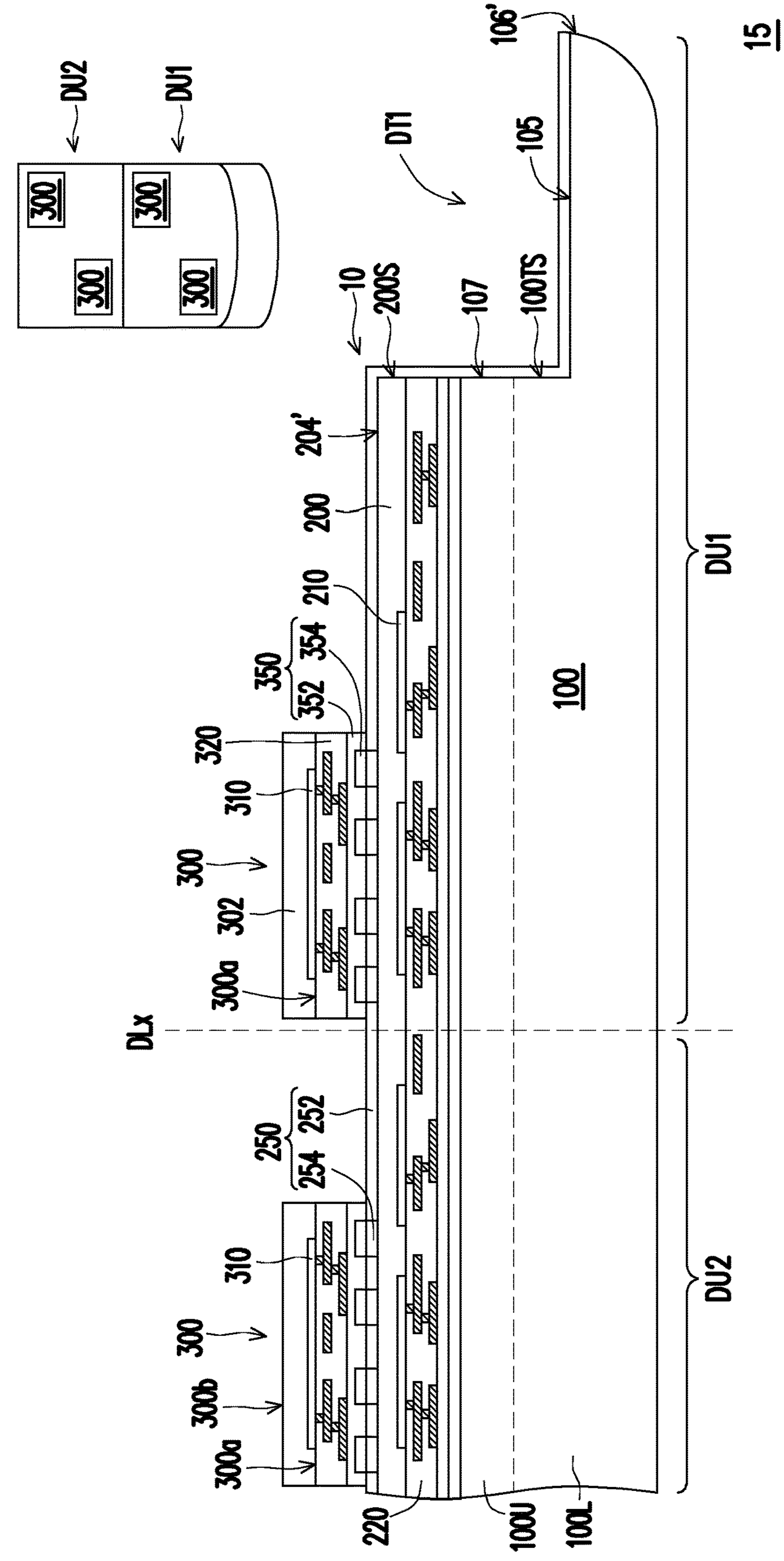

Following the edge trimming process shown in FIG. 4, the schematic cross-sectional views of FIG. 7 and FIG. 8 may refer to certain portions of the stacked wafer structure 10 along the cross-sectional lines I-I' and II-II' seen in FIG. 5 respectively. As seen in FIG. 8, defined by the dicing lane DLx, one outer die unit DU1 and one inner die unit DU2 are shown for illustration purposes. In FIG. 7, only one outer die unit DU1 is shown.

As seen in FIG. 7 and FIG. 8, a first bonding structure 250 that includes a first bonding dielectric layer 252 and bonding pads 254 embedded in the first bonding dielectric layer 252 is formed over the trimmed stacked wafer structure 10. In some embodiments, the formation of the first bonding structure 250 involves forming the first bonding dielectric layer 252 over and covering the surface 204' of the second wafer 200, over the sidewall(s) 107 and bottom surface 105 of the trench DT1, forming openings in the first bonding dielectric layer at specific locations exposing the surface 204', and forming bonding pads 254 in the openings of the first dielectric layers and on the surface 204'. In some embodiments, some of the first bonding pads 254 are electrically connected with the devices formed in the device layers 210 by way of conductive elements (e.g. through semiconductor vias) formed in the second wafer 200.

Later, in some embodiments, a plurality of semiconductor dies 300 is provided and mounted on the stacked wafer structure 10. As seen in the schematic top view at the right part of FIG. 8, in some embodiments, at least two semiconductor dies 300 are disposed in the individual die unit DU1 or DU2. From the schematic cross-sectional views of FIG. 7 and FIG. 8, for simplicity, only one semiconductor die 300 is shown mounted onto the outer die unit DU1, and only one semiconductor die 300 is shown mounted onto the inner die unit DU2. In alternative embodiments, the number of the semiconductor dies 300 included in each die unit may be one, two, three or more, but the disclosure is not limited thereto. However, it is understood that multiple semiconductor dies 300 may be mounted and bonded onto the die units of the second wafer 200, and the semiconductor dies 300 shown in each die unit may include two or more types of functional dies. In some embodiments, the semiconductor dies 300 may have the same function or different functions. In some embodiments, the semiconductor die 300 includes a memory die such as a high bandwidth memory (HBM) die, a dynamic random access memory (DRAM) die or a static random access memory (SRAM) die. In some embodiments, the semiconductor dies 300 may include an application-specific integrated circuit (ASIC) chip, an analog chip, a sensor chip, a wireless application chip such as a Bluetooth chip, and a radio frequency chip or a voltage regulator chip. Herein, terms like chip or die may be used interchangeably in the contexts.

As seen in FIG. 7 and FIG. 8, each semiconductor die 300 has an active surface 300*a* and a rear surface 300*b* opposite to the active surface 300*a*. In some embodiments, the active surface 300*a* faces the stacked wafer structure 10, while the rear surface 300*b* faces upward. In detail, each semiconductor die 300 includes a device layer 310 located in the semiconductor substrate 302, interconnection structure 320 located on the semiconductor substrate 302, and a second bonding structure 350 formed on the interconnection structure 320. In some embodiments, the second bonding structure 350 includes a second bonding dielectric layer 352 and second bonding pads 354 embedded in the second bonding dielectric layer 352. In some embodiments, the interconnection structure 320 is formed on the active surface 300*a* of the semiconductor die 300. In some embodiments, some or all of the second bonding pads 354 are electrically connected with the interconnection structure 320, and may be further electrically connected to the devices formed in the device layer 310 of the semiconductor die 300.

In some embodiments, the semiconductor dies 300 are picked, aligned and then placed on the stacked wafer structure 10. In some embodiments, the arrangement of the semiconductor dies 300 is adjusted and aligned so that the second bonding pads 354 of the semiconductor dies 300 are aligned with and placed directly on the first bonding pads 254. As shown in FIG. 7 and FIG. 8, when the semiconductor dies 300 are mounted on the stacked wafer structure 10, the second bonding pads 354 of the semiconductor dies 300 are aligned with and in direct contact with the first bonding pads 254 located on the surface 204', and the second bonding dielectric layer 352 is located directly on and in contact with the first bonding dielectric layer 252.

In some embodiments, the semiconductor substrate 302 of the semiconductor die 300 includes a silicon substrate, and the device layer 310 includes devices such as active devices (e.g., transistors, diodes or the like) and/or passive devices (e.g., resistors, capacitors, inductors, or the like) formed therein. In some embodiments, the material of the first bonding dielectric layer 252 is substantially the same as the material of the second bonding dielectric layer 352. In some embodiments, the material of the first or second bonding dielectric layer 252, 352 individually includes silicon oxide, silicon carbonitride (SiCN), silicon nitride, or a combination thereof. For example, the first or second bonding dielectric layer may be formed by chemical vapor deposition (CVD). In some embodiments, the material of the first bonding pads 254 is substantially the same as the material of the second bonding pads 354. In some embodiments, the first or second bonding pads 254, 354 are metal pads made of a metal material selected from copper, copper alloys, aluminum, aluminum alloys, tungsten, or combinations thereof.

Referring to FIG. 7 and FIG. 8, a bonding process is performed to bond the semiconductor dies 300 to the second wafer 200 through hybrid bonding technique to form a stacked structure 15. For example, the second bonding dielectric layer 352 is bonded with the first bonding dielectric layer 252 via dielectric-to-dielectric bonding, and the second bonding pads 354 of the semiconductor dies 300 are bonded with the first bonding pads 254 of the first bonding structure 250 via metal-to-metal bonding. In some embodiments, the bonding process includes a hybrid bonding process performed at temperature ranging from about 100 Celsius degree to about 400 Celsius degree.

As seen in FIG. 7 and FIG. 8, after bonding, except for the portions covered by the semiconductor dies 300, the uncovered portions of the first bonding dielectric layer 252 are exposed. After bonding, the semiconductor dies 300 are electrically connected with the die units of the second wafer 200.

Figure 9:
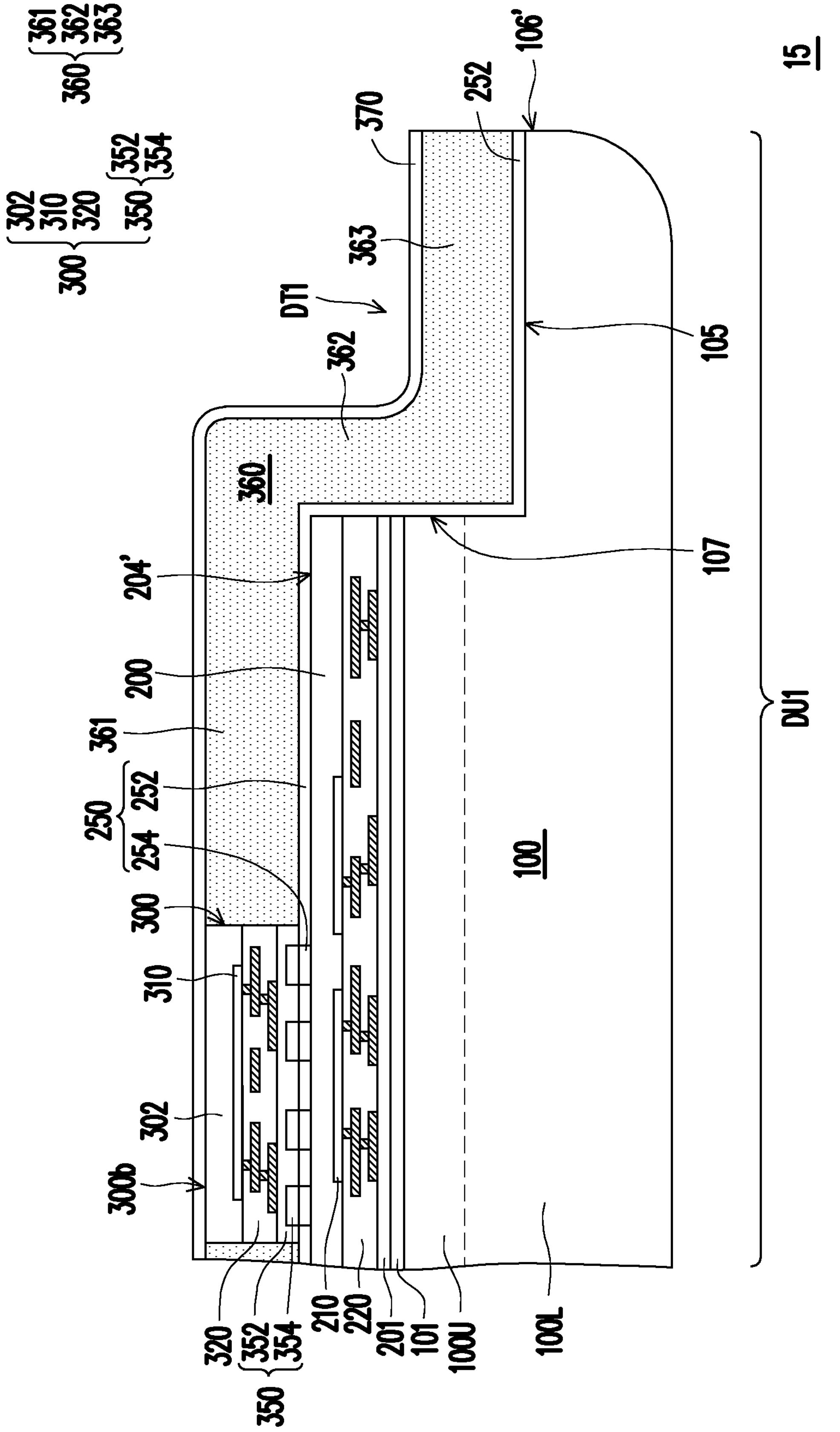
Figure 10:
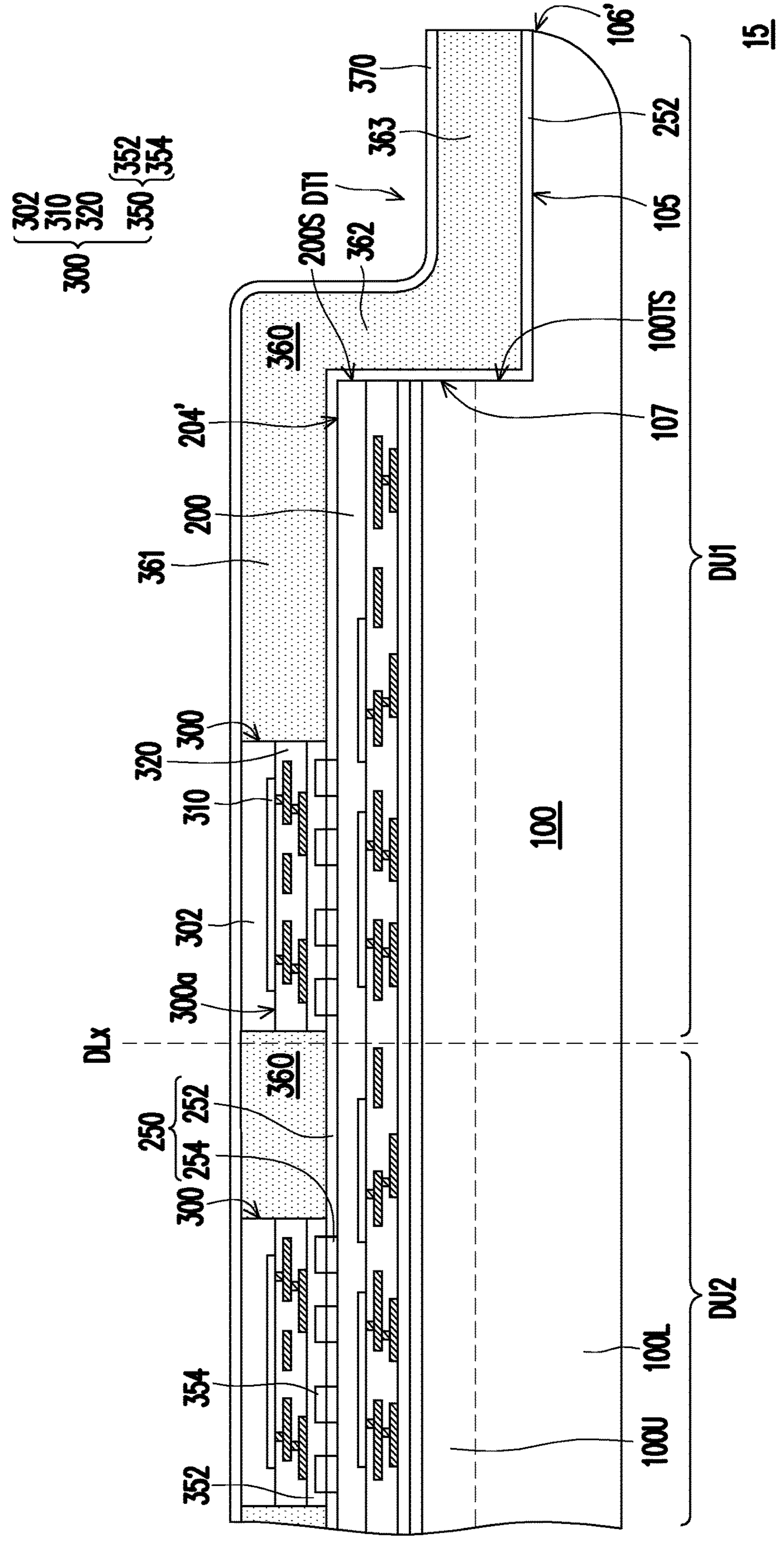

Following the die bonding process, the schematic cross-sectional views of FIG. 9 and FIG. 10 may refer to certain portions of the stacked structure 15 along the cross-sectional lines I-I' and II-II' respectively.

Referring to FIG. 9 and FIG. 10, a filling material 360 is formed over the stacked structure 15 covering the semiconductor dies 300 and covering the exposed portions of the first bonding dielectric layer 252. As seen in FIG. 9 and FIG. 10, the filling material 360 also fills into the trench DT1 covering the first bonding dielectric layer 252 located on the sidewall(s) 107 and bottom surface 105 of the trench DT1. However, the filling material 360 does not fill up the trench DT1. In some embodiments, the formation of the filling material 360 includes forming a dielectric material over the semiconductor dies 300 and the exposed first bonding dielectric layer 252. In some embodiments, the dielectric material may be formed by spin-on coating, molding or deposition (such as CVD). In some embodiments, the dielectric material fully covers the semiconductor dies 300 and fills between the semiconductor dies 300, and a curing process may be optionally performed. Then, a planarization process is performed to remove the dielectric material over the semiconductor dies 300 to reveal the rear surfaces 300*b* of the semiconductor dies 300. In some embodiments, during the planarization process, the dielectric material is polished or grinded until the semiconductor substrates 302 of the semiconductor dies 300 are exposed. In some embodiments, the planarization process includes performing a mechanical grinding process, a chemical mechanical polishing (CMP) process or the combination thereof.

As seen in FIG. 9 and FIG. 10, the filling material 360 includes a main portion 361 that is located above the second wafer 200 filling between the semiconductor dies 300 and at least laterally wrapping the semiconductor dies 300. Further, the filling material 360 includes a drape portion 362 extending over the sidewall 107 of the trench DT1 and an extension portion 363 extending over the bottom surface 105 of the trench DT1. In some embodiments, through the planarization process, the exposed rear surfaces 300*b* of the semiconductor dies 300 become substantially levelled with the top surface of the main portion 361 of the filling material 360.

In FIG. 9 and FIG. 10, the sidewall 107 of the trench DT1 is fully covered by the filling material 360 (the drape portion 362). In some embodiments, as the trench DT1 is formed with the over-trim depth, the later formed filling material 360 not only covers the sidewall 200S of the second wafer but also protects the trimmed sidewall 100TS of the first wafer 100.

Later, referring to FIG. 9 and FIG. 10, a capping layer 370 is conformally formed over the stacked structure 15 conformally covering the filling material 360 and covering the exposed semiconductor dies 300. In some embodiments, the capping layer 370 is formed by deposition such as CVD, atomic layer deposition (ALD) or physical vapor deposition (PVD).

In some embodiments, the dielectric material of the filling material 360 includes silicon oxide, silicon nitride, a polymeric material (such as epoxy resins or phenolic resins) or a combination thereof. In some embodiments, the material of the capping layer 370 includes an oxide material such as silicon oxide. In some embodiments, the filling material 360 and the capping layer 370 are made of different materials or are made through different processes.

Figure 11:
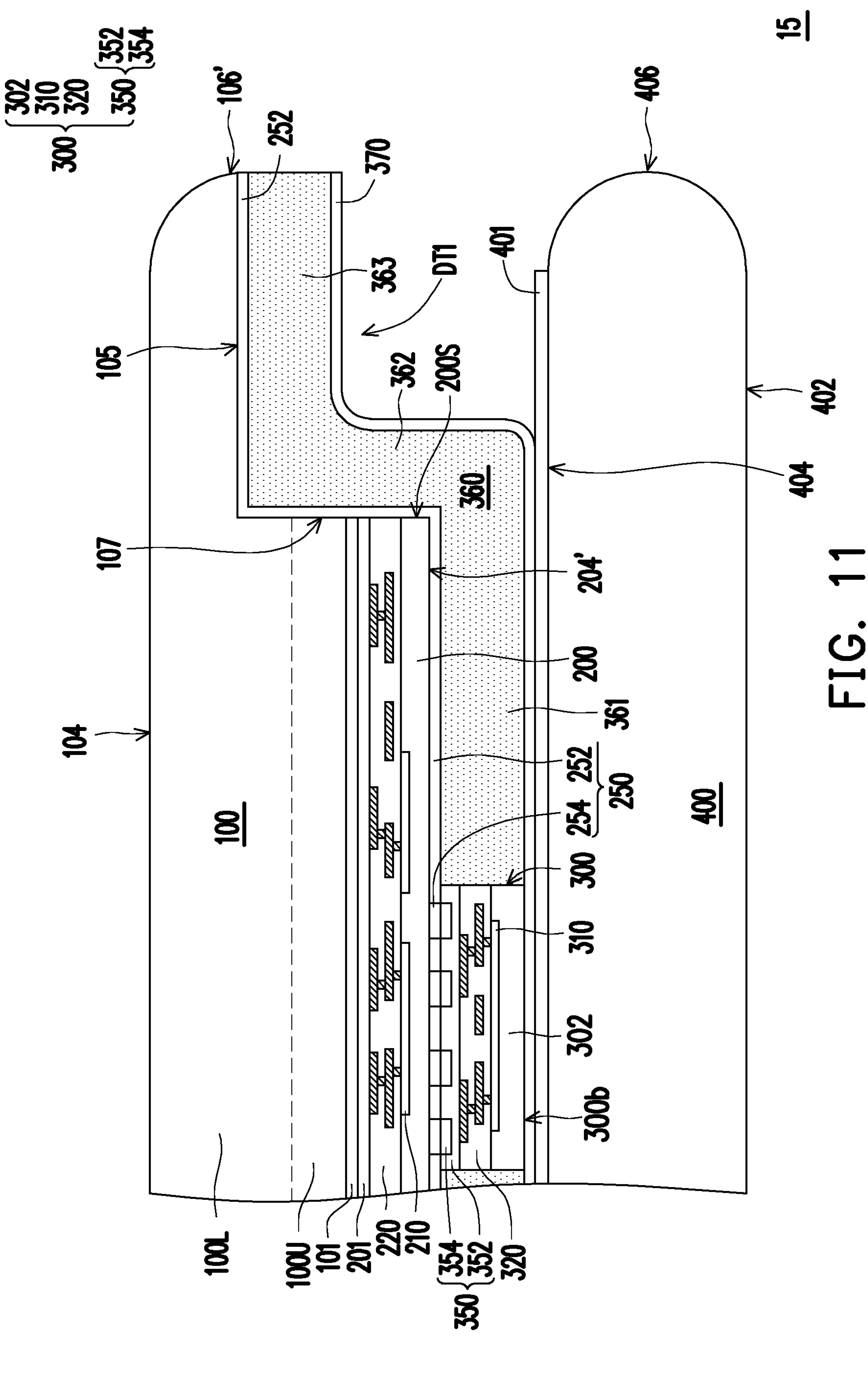
Figure 12:
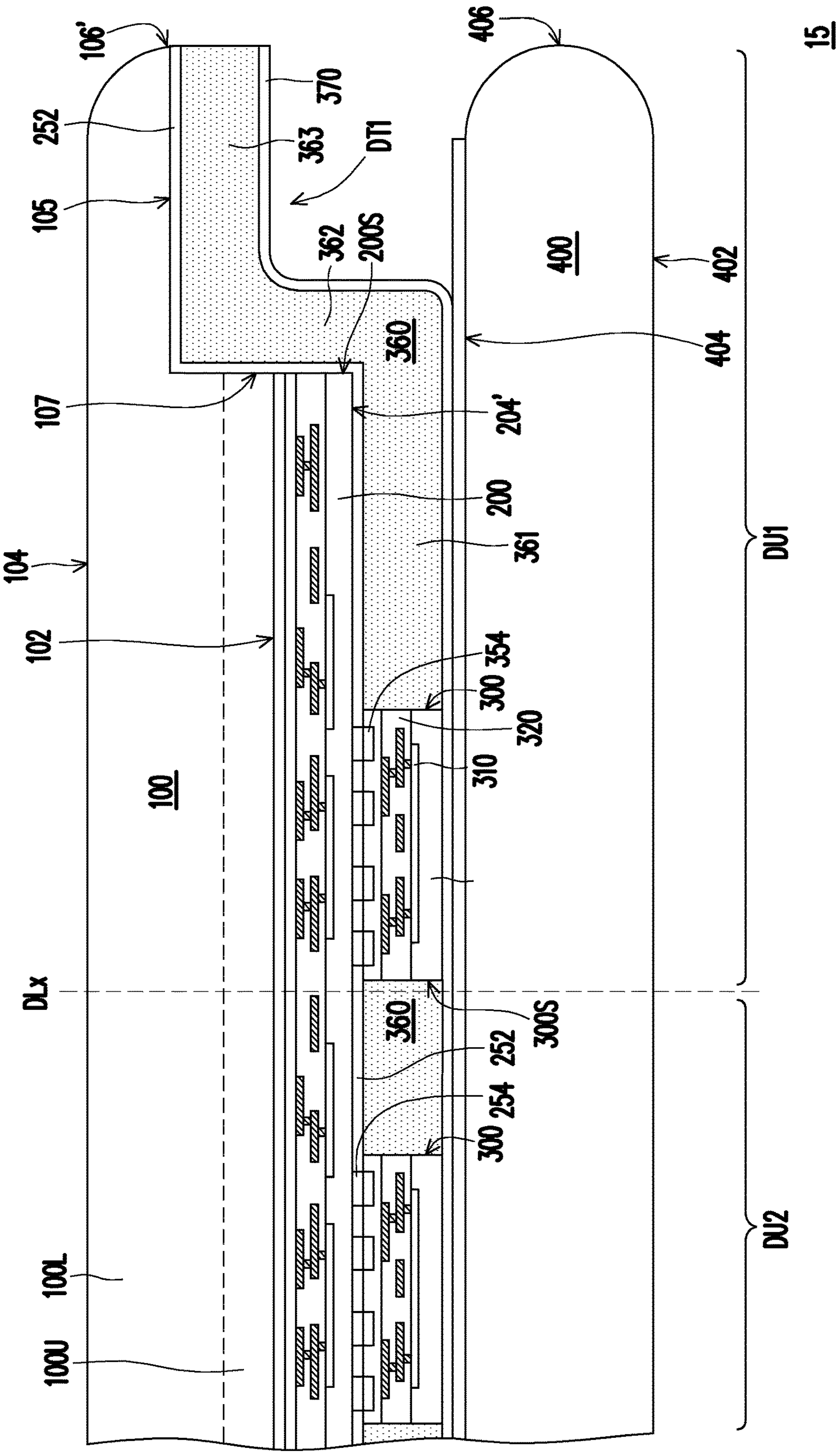

Following the formation of the filling material 360 and the capping layer 370, FIG. 11 and FIG. 12 are schematic cross-sectional views showing certain portions of the stacked structure 15 along the cross-sectional lines I-I' and II-II' respectively.

Referring to FIG. 11 and FIG. 12, a fourth wafer 400 is provided and adhered to the stacked structure 15, and the whole stacked structure 15 is flipped (turned upside down). In some embodiments, the fourth wafer 400 has a third surface 402, a fourth surface 404 opposite to the third surface 402, and an edge surface 406 connecting the surfaces 402 and 404. In some embodiments, the fourth wafer 400 functions as a carrier wafer and may be of any appropriate size and shape. In some embodiments, the fourth wafer 400 is or includes a semiconductor bulk wafer. For example, the fourth wafer 400 is a wafer of a round or oval shape. In some embodiments, a bonding layer 401 is provided on the surface 404 of the fourth wafer 400. In some embodiments, the bonding layer 401 is an oxide layer or includes a silicon oxide layer. After disposing the fourth wafer 400 onto the stacked structure 15, the bonding layer 401 is in direct contact with the capping layer 370 and the fourth wafer 400 is temporarily adhered to the stacked structure 15. After adhering with the fourth wafer 400 and turning the whole stacked structure 15 upside down, the surface 104 of the lower portion 100L of the first wafer 100 faces upward and is exposed, and the lower portion 100L is located above the upper portion 100U. As seen in FIG. 12, for the die units DU2, only the main portion 361 of the filling material 360 covers the sidewalls of the semiconductor dies 300, but for the die units DU1, the filling material 360 not only covers the sidewalls 300S of the semiconductor dies 300 but also covers the sidewall 200S of the second wafer 200 and the first wafer 100 (the trench sidewall).

Figure 13:
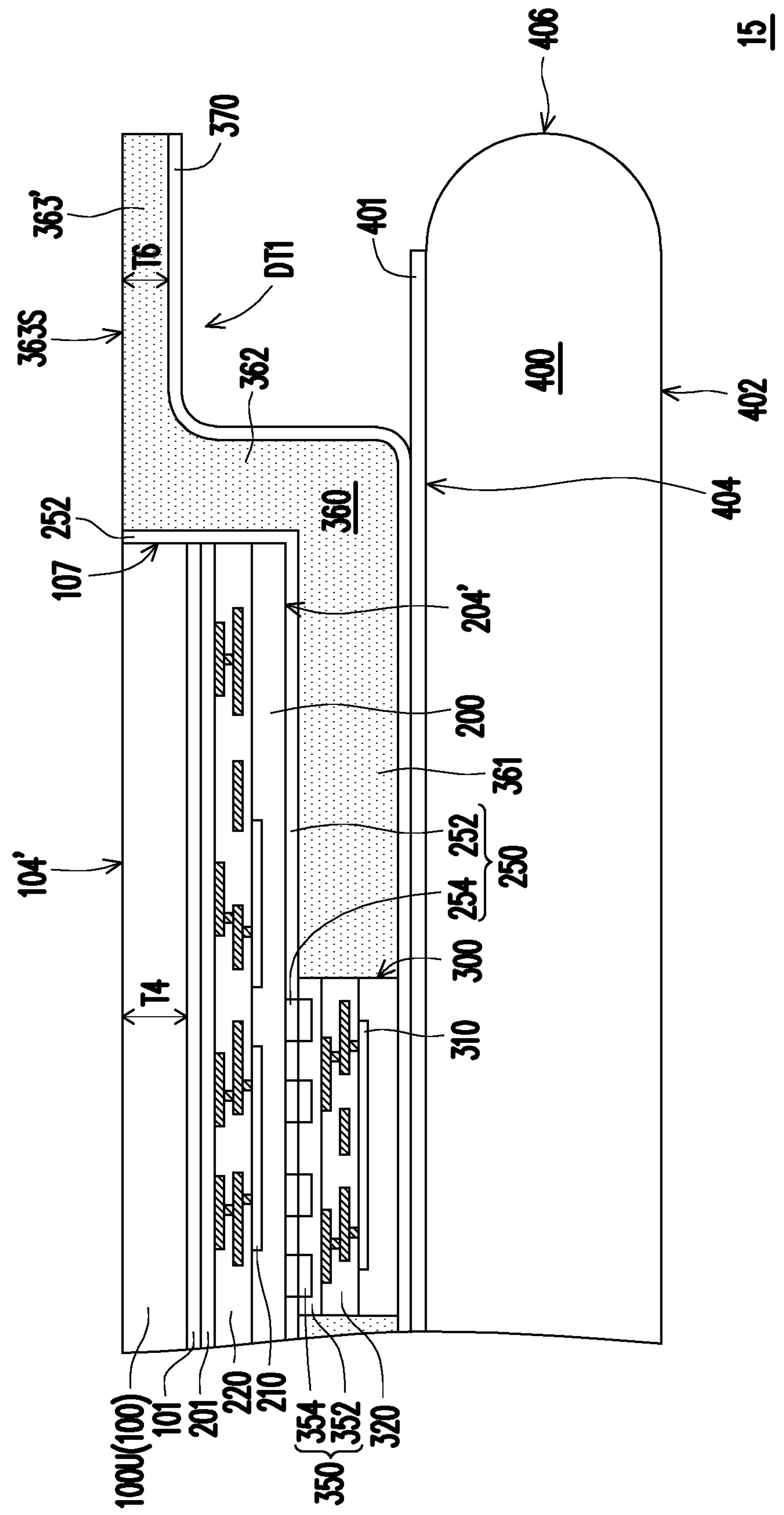
Figure 14:
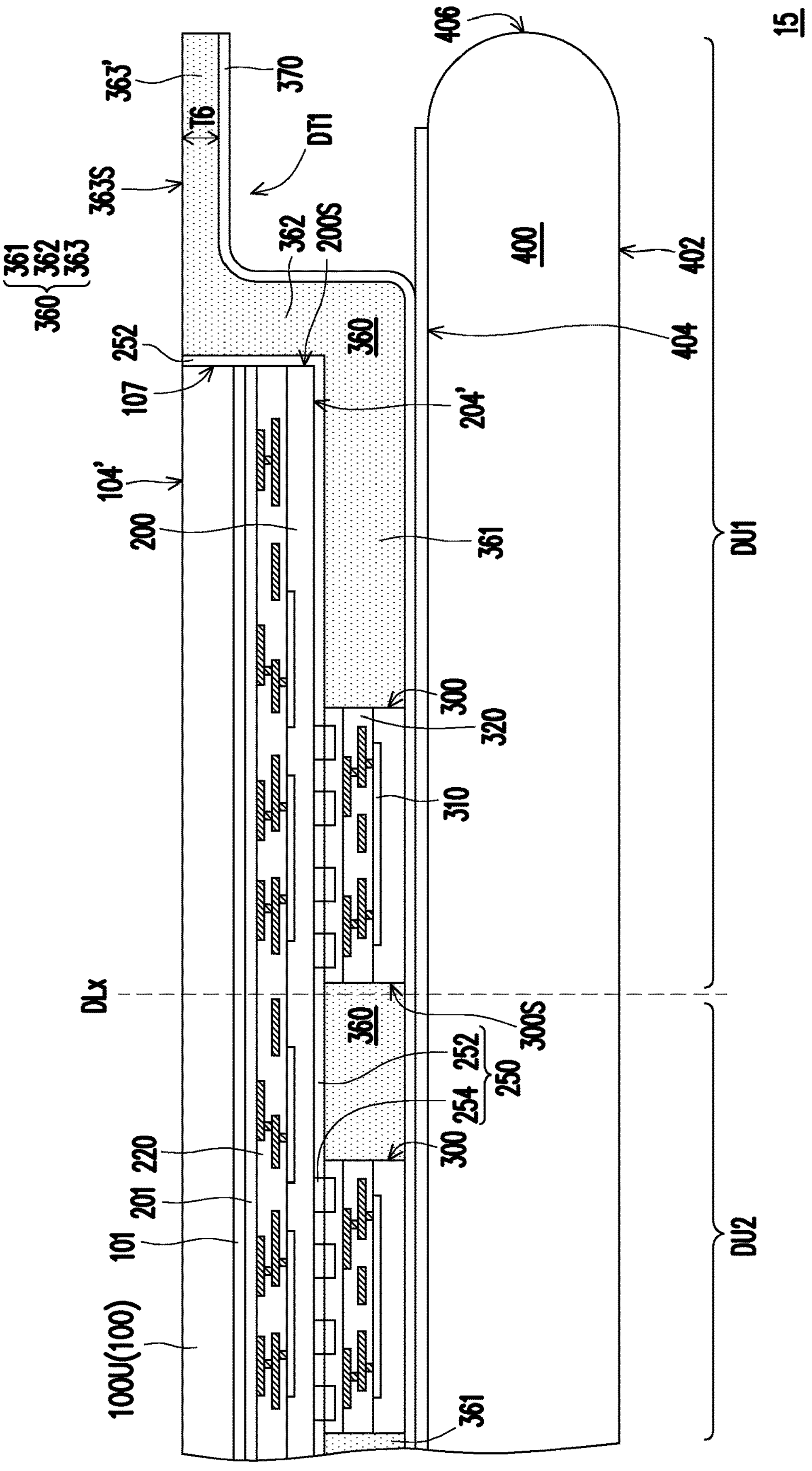

Following the flipping process, the schematic cross-sectional views of FIG. 13 and FIG. 14 show certain portions of the stacked structure 15 along the cross-sectional lines I-I' and II-II' respectively.

Referring to FIG. 13 and FIG. 14, a wafer thinning process is performed to the first wafer 100 of the stacked structure 15 from the exposed surface 104 of the first wafer 100. Referring to FIG. 13 and FIG. 14, the first wafer 100 is thinned (i.e. the thickness of the first wafer 100 is reduced) by performing a mechanical machining process, and the mechanical machining process includes, for example, a grinding process, a chemical mechanical polishing (CMP) process, or other suitable polishing process. In some embodiments, the first wafer 100 is thinned from the second surface 104 downward towards the first surface 102 but not cutting through the first wafer 100. In some embodiments, the wafer thinning process includes one or more thin-down processes, and the wafer thinning process is performed to the first wafer 100 to reduce the thickness of the first wafer 100 until it reaches the desired remained thickness T4. For example, during performing the wafer thinning process, the first wafer 100 of the stacked structure 15 is thinned until the lower portion 100L is substantially removed while the upper portion 100U is remained. As the wafer thinning process is performed globally, the extension portion 363 is also partially removed. As the first wafer 100 and the filling material 360 are removed through the same wafer thinning process, the surface 104' of the remained first wafer 100 (the remained upper portion 100U) is substantially levelled with the surface 363S of the remained extension portion 363'. As seen in FIG. 14, for the die units DU2, only the main portion 361 of the filling material 360 covers the sidewalls of the semiconductor dies 300. But for the die units DU1, the main portion 361 of the filling material 360 covers the sidewalls of the semiconductor dies 300, and the drape portion and the remined extension portion 363' cover the sidewall 200S of the second wafer 200 and the sidewall of the thinned first wafer 100.

In some embodiments, the thickness T4 of the upper portion 100U of the thinned first wafer 100 almost equals to the thickness T6 of the remained extension portion 363'. In some embodiments, the thickness T4 of the upper portion 100U of the thinned first wafer 100 is larger than the thickness T6 of the remained extension portion 363', depending on the original thickness of the filling material 360. Since the fragile edge of the first wafer 100 is edge-trimmed during the edge trimming process before performing the wafer thinning process to the first wafer 100, the undesirable edge-cracking issue due to sharp edges of the thinned wafer can be eliminated and a more robust stacked structure is obtained. Satisfactory yield can be achieved through such more robust stacked structure and more reliable manufacturing processes. Herein, as the filling material 360 is more resilient, the remained extension portion 363' and the drape portion 362 of the filling material 360 function as buffers and protect the sidewalls of the stacked structure 15, especially the sidewall 200S of the second wafer 200 and the sidewall of the remained first wafer 100.

In some embodiments, if the original thickness of the filling material in the trench is not thick enough, the extension portion 363 may be completely removed during the wafer thinning process.

Figure 15:
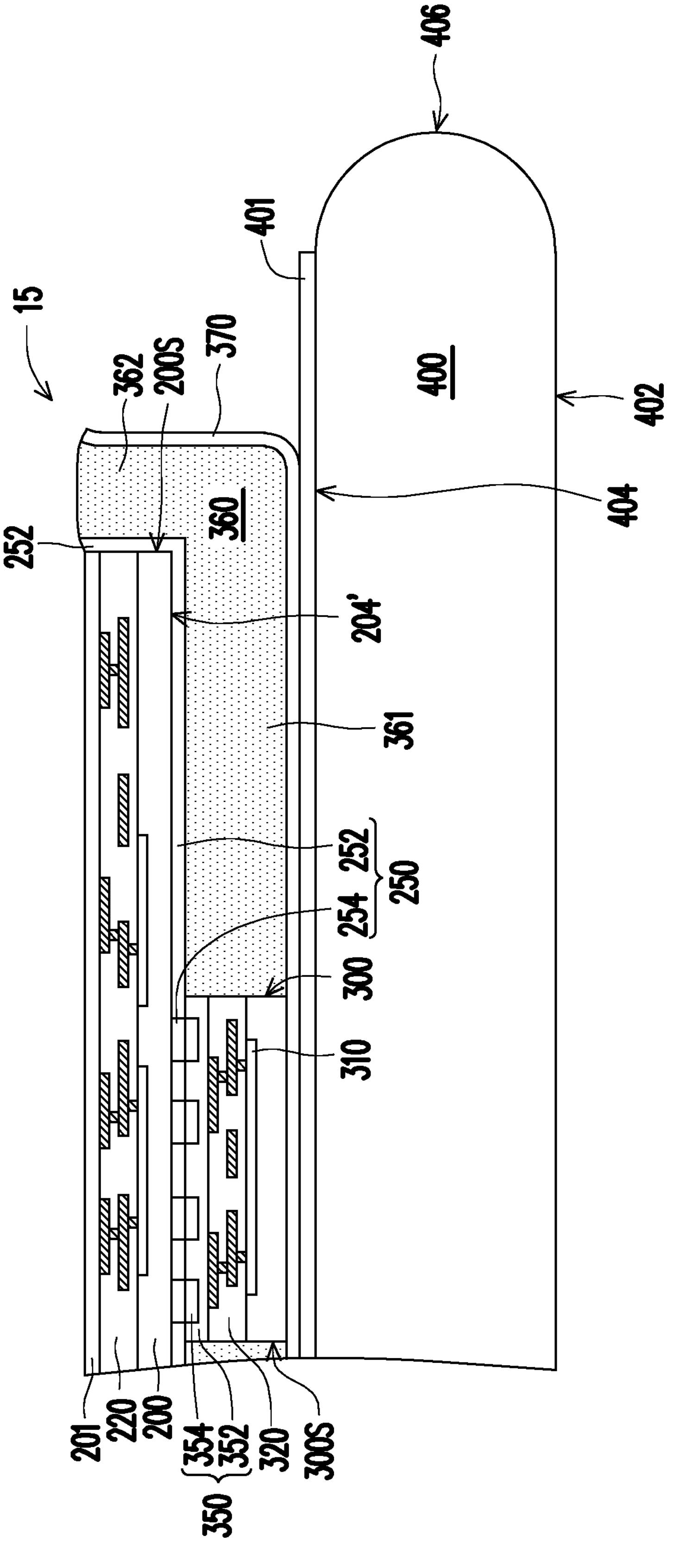
Figure 16:
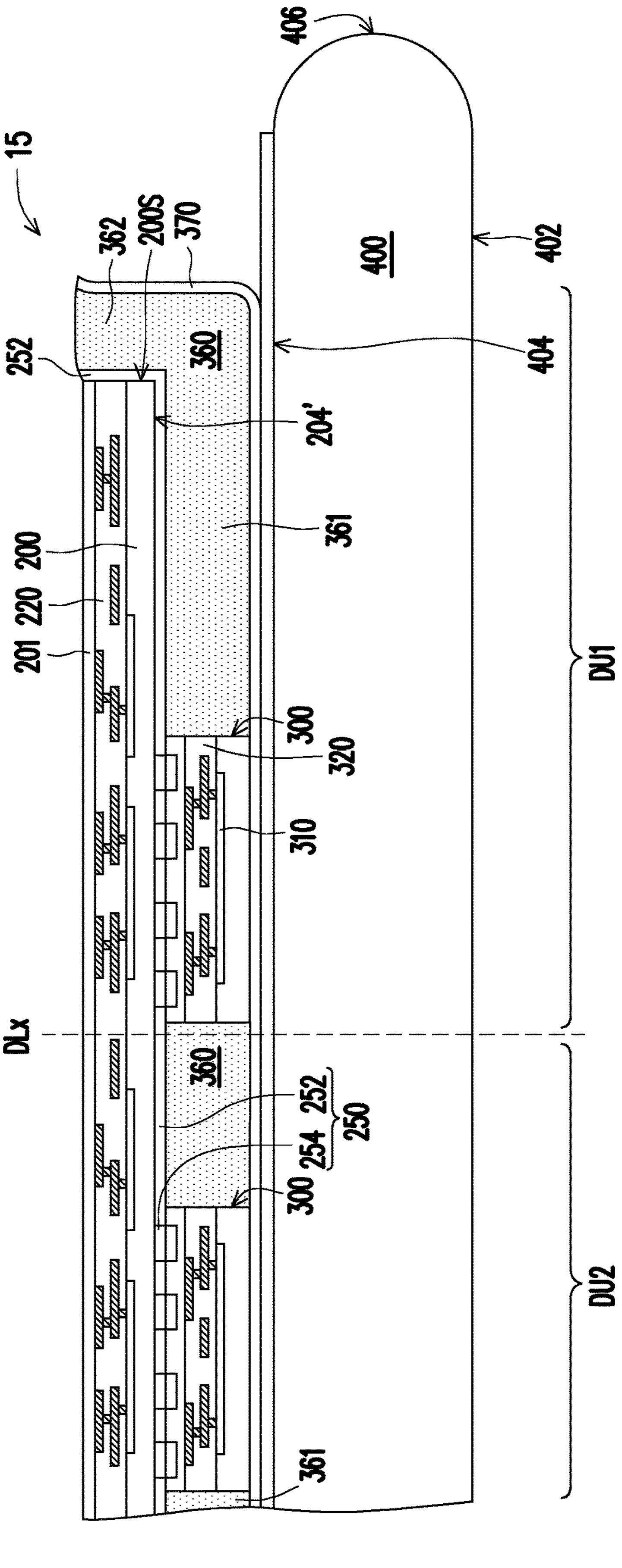

Referring to FIG. 15 and FIG. 16, in some embodiments, after the wafer thinning process, an etching process is performed to remove the remained first wafer 100. In certain embodiments, the remained extension portion 363' is also removed during the etching process, while the drape portion 362 is remained to protect the sidewall 200S of the second wafer 200 and the sidewall of the interconnection structure 220. As seen in FIG. 16, for the die units DU2, only the main portion 361 of the filling material 360 is present and the main portion 361 covers the sidewalls 300S of the semiconductor dies 300. In FIG. 16, for the die units DU1, the remained drape portion 361 of the filling material 360 covers the sidewall 200S of the second wafer 200 and the sidewall of the interconnection structure 220, while the main portion 361 covers the sidewalls 300S of the semiconductor dies 300 after etching off the first wafer 100. In some embodiments, the remained drape portion 361 is slightly higher than the bonding layer 201 and is higher than the surface of the second wafer 200.

For example, the etching process includes a wet etching process. In some embodiments, the wet etching process employs a mixture of hydrofluoric acid/nitric acid/acetic acid as the etchant. In some other embodiments, the etching process includes performing a dry etching process to remove the remained first wafer 100, and the dry etching process may include a reactive ion etching (RIE) process. During the etching process, the bonding layer(s) 101 is removed, and the bonding layer 201 may be optionally removed at the same time or at a later stage.

Figure 17:
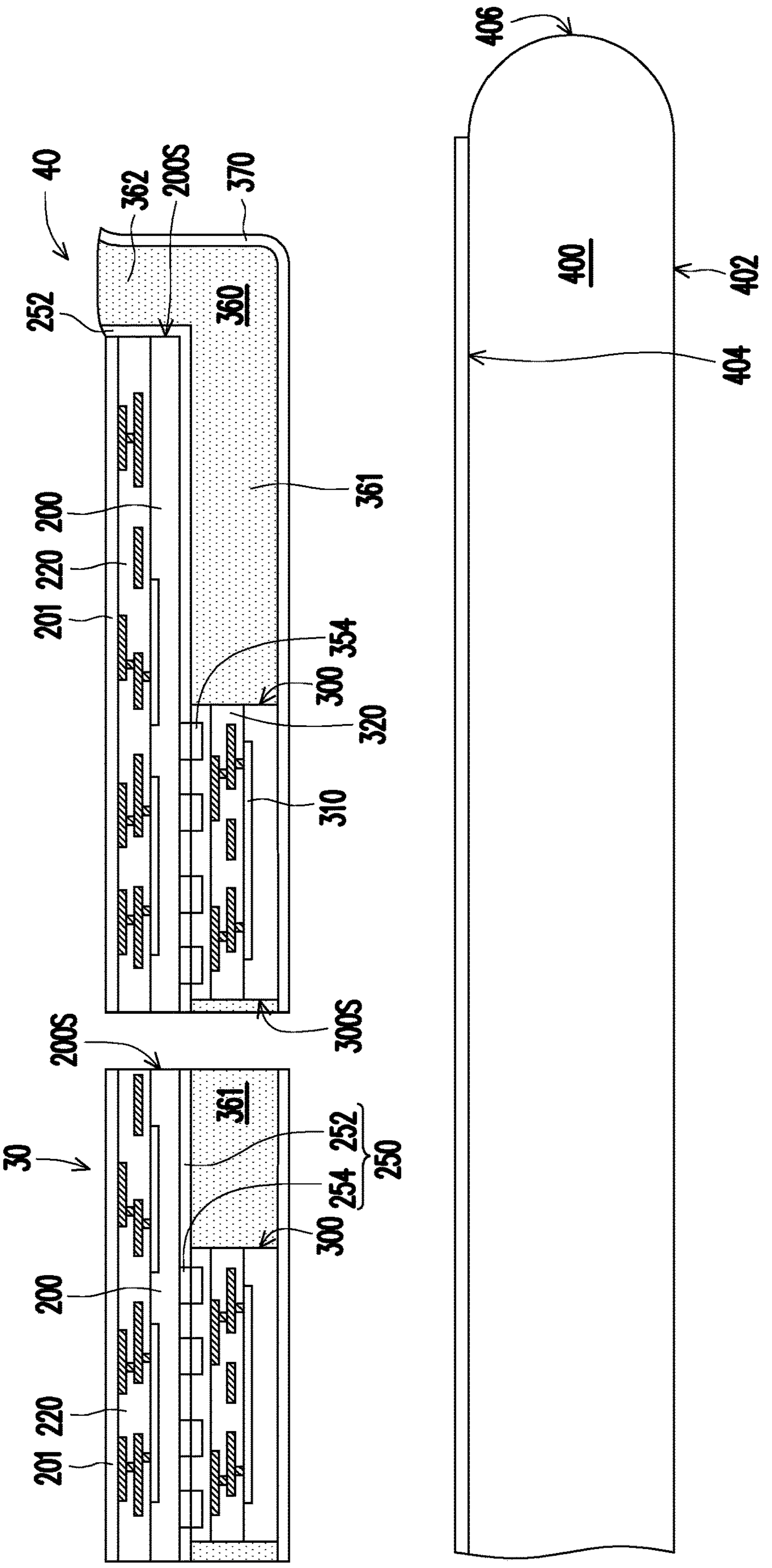
FIG. 17 illustrates a schematic cross-sectional view of the stacked structure after performing a singulation process, in accordance with some embodiments of the present disclosure.

FIG. 17 illustrates a schematic cross-sectional view of the stacked structure after performing a singulation process, in accordance with some embodiments of the present disclosure.

Referring to FIG. 17, in some embodiments, a singulation process is performed to the stacked structure 15 to separate the inner and outer die units DU2, DU1 into first unit dies 30 and second unit dies 40. In some embodiments, the singulation process includes, for example, performing one or more mechanical blading or laser sawing process. Later, the fourth wafer 400 is separated from the individual unit dies 30, 40 and may be removed or recycled.

As shown in FIG. 17, the first unit dies 30 are obtained from the die units DU2, while the second unit dies 40 are obtained from the die units DU1. Each unit die 30 or 40 includes semiconductor dies 300 stacked on and bonded to a second die 20 (the diced portion of the second wafer) and the filling material 360 disposed on the second die 20 and laterally wraps around the semiconductor dies 300. For the unit die 30 or 40, the second die 20 and the semiconductor dies 30 are bonded and electrically connected through the bonding structures 250, 350. Compared with the unit die 30, the unit die 40 obtained the outer die unit DU1 has one side left uncut (the outer sidewall) after the singulation process. Hence, for the unit die 40, the filling material 360 not only laterally wraps and covers the sidewalls of the semiconductor dies 300 but also covers a sidewall of the second die 20. On the other hand, for the unit die 30, the sidewalls of the second die 20 are exposed without being covered by the filling material 360.

In accordance with the present disclosure, the edge trimming process performed to the stacked semiconductor structure removes the fragile edges of the thinned wafer that are susceptible to chipping and cracking. In other words, the edge portions that may include defects at the periphery of the stacked wafer structure are removed by the over-cut edge trimming process. That is, by trimming off the edge portions, the device layers of the dies will not be damaged, the risks of edge-peeling or chipping are lowered and the product yield is increased.

Based on the above, due to the over-cut trimming process, larger process window and higher operation efficiency are offered. Also, as edge chipping or peeling is lessened, the loss in the manufacturing yield is prevented.

According to some embodiments, a trimming method is provided. The trimming method includes the following steps. A first wafer having a first surface and a second surface opposite to the first surface is provided. The first wafer has a first portion closer to the first surface and a second portion connected with the first portion and closer to the second surface, and the second portion is thicker than the first portion. A second wafer is provided, and the first wafer and the second wafer are bonded to form a stacked wafer structure. An edge trimming process is performed to the stacked wafer structure to form a trench penetrating through the second wafer and extending beyond the first portion and extending into the second portion of the first wafer. Semiconductor dies are bonded to the second wafer. A filling material is formed over the semiconductor dies and the first and second wafers, wrapping around and filling between the semiconductor dies, covering the second wafer, covering the first wafer and partially filling the trench. A wafer thinning process is performed to remove the second portion of the first wafer and partially remove the filling material in the trench. A surface of the thinned first wafer is levelled with a surface of the thinned filling material.

According to some alternative embodiments, a trimming method is provided. The trimming method includes the following steps. A first wafer having a first surface and a second surface opposite to the first surface is provided. The first wafer has a first portion of a first thickness and closer to the first surface and a second portion of a second thickness, connected with the first portion and closer to the second surface. A second wafer having a third surface and a fourth surface opposite to the third surface is provided. The first surface of the first wafer is bonded with the fourth surface of the second wafer to form a stacked wafer structure. The second wafer is thinned from the third surface. An edge trimming process is performed to the stacked wafer structure to form a trench penetrating through the second wafer and extending into the first wafer with a first depth. The first depth is larger than the first thickness. Semiconductor dies are bonded to the second wafer to form a stacked structure. A filling material is formed over the stacked structure, wrapping around and filling between the semiconductor dies, covering the second wafer and covering a sidewall and a bottom surface of the trench without filling up the trench. After flipping the stacked structure, a wafer thinning process is performed to partially remove the first wafer from the second surface and partially removing the filling material in the trench, so that the second portion of the first wafer is removed and the first portion of the first wafer and a portion of the filling material on a sidewall of the trench are remained.

According to some alternative embodiments, a stacked structure is provided. The stacked structure includes a wafer, semiconductor dies and a filling material. The wafer has a first surface, a second surface opposite to the first surface and a sidewall connecting the first surface and the second surface. The semiconductor dies are stacked on the second surface of the wafer and bonded to the wafer. The filling material is disposed on the second surface of the wafer, filling between and wrapping around sidewalls of the semiconductor dies, and covering the sidewall of the wafer. The stacked structure includes first die units and second die units connected with one another, the first die units are located in a bordering region of the wafer surrounding the second die units in an inner mid region of the wafer. The filling material covers the second surface and the sidewall of the wafer in the first die units, while the filling material covers only the second surface of the wafer in the second die units.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A trimming method, comprising:

providing a first wafer having a first surface and a second surface opposite to the first surface, wherein the first wafer has a first portion closer to the first surface and a second portion connected with the first portion and closer to the second surface, and the second portion is thicker than the first portion;

providing a second wafer;

bonding the first wafer and the second wafer to form a stacked wafer structure;

performing an edge trimming process to the stacked wafer structure to form a trench penetrating through the second wafer and extending beyond the first portion and extending into the second portion of the first wafer;

bonding semiconductor dies to the second wafer;

forming a filling material over the semiconductor dies and the first and second wafers, wrapping around and filling between the semiconductor dies, covering the second wafer, covering the first wafer and partially filling the trench; and performing a wafer thinning process to remove the second portion of the first wafer and partially remove the filling material in the trench, wherein a surface of the thinned first wafer is levelled with a surface of the thinned filling material.

2. The trimming method according to claim 1, further comprising performing a thinning process to the second wafer after bonding the first wafer and the second wafer and before bonding semiconductor dies to the second wafer.

3. The trimming method according to claim 2, wherein bonding semiconductor dies to the second wafer includes:

forming a first bonding structure over the second wafer;

providing the semiconductor dies formed with second bonding structures thereon; and bonding the second bonding structures of the semiconductor dies to the first bonding structure on the second wafer.

4. The trimming method according to claim 3, wherein bonding the second bonding structures of the semiconductor dies to the first bonding structure on the second wafer comprises performing a bonding process at temperature ranging from about 100 Celsius degree to about 400 Celsius degree.

5. The trimming method according to claim 1, wherein the trench is formed by removing a peripheral portion of the stacked structure.

6. The trimming method according to claim 1, wherein the filling material is formed with a main portion on the second wafer, filling between the semiconductor dies and at least laterally wrapping the semiconductor dies, a drape portion extending over a sidewall of the trench, and an extension portion extending over a bottom surface of the trench.

7. The trimming method according to claim 6, wherein the wafer thinning process removes the second portion of the first wafer from the second surface and removes the extension portion of the filling material.

8. The trimming method according to claim 1, further comprising performing an etching process to remove the thinned first wafer after performing the wafer thinning process.

9. The trimming method according to claim 1, wherein the second wafer is a device wafer, and the first and second wafers are bonded through dielectric bonding layers.

10. A trimming method, comprising:

providing a first wafer having a first surface and a second surface opposite to the first surface, wherein the first wafer has a first portion of a first thickness and closer to the first surface and a second portion of a second thickness, connected with the first portion and closer to the second surface;

providing a second wafer having a third surface and a fourth surface opposite to the third surface;

bonding the first surface of the first wafer with the fourth surface of the second wafer to form a stacked wafer structure;

thinning the second wafer from the third surface;

performing an edge trimming process to the stacked wafer structure to form a trench penetrating through the second wafer and extending into the first wafer with a first depth, wherein the first depth is larger than the first thickness;

bonding semiconductor dies to the second wafer to form a stacked structure;

forming a filling material over the stacked structure, wrapping around and filling between the semiconductor dies, covering the second wafer and covering a sidewall and a bottom surface of the trench without filling up the trench;

flipping the stacked structure; and performing a wafer thinning process to partially remove the first wafer from the second surface and partially removing the filling material in the trench, wherein the second portion of the first wafer is removed and the first portion of the first wafer and a portion of the filling material on the sidewall of the trench are remained.

11. The trimming method according to claim 10, wherein bonding the first surface of the first wafer with the fourth surface of the second wafer to form a stacked wafer structure includes:

forming a first bonding film on the first surface of the first wafer;

forming a second bonding film on the fourth surface of the second wafer;

bringing the first and second wafers in contact and bringing the first and second bonding films in contact; and performing a thermal annealing process to bond the first and second bonding films.

12. The trimming method according to claim 10, wherein bonding semiconductor dies to the second wafer includes:

forming a first bonding structure on the second wafer;

providing the semiconductor dies formed with second bonding structures thereon; and performing a bonding process to bond the second bonding structures of the semiconductor dies with the first bonding structure on the second wafer.

13. The trimming method according to claim 10, wherein forming the filling material over the stacked structure includes forming a dielectric material over the stacked structure and curing the dielectric material to form the filling material with a main portion on the second wafer, filling between the semiconductor dies and at least laterally wrapping the semiconductor dies, a drape portion extending over a sidewall of the trench, and an extension portion extending over a bottom surface of the trench.

14. The trimming method according to claim 13, wherein the wafer thinning process removes the second portion of the first wafer and removes the extension portion of the filling material simultaneously.

15. The trimming method according to claim 14, further comprising performing an etching process to remove the remained first wafer after performing the wafer thinning process.

16. The trimming method according to claim 10, wherein thinning the second wafer from the third surface is performed after bonding the first wafer and the second wafer.

17. A trimming method, comprising:

providing a first semiconductor wafer having a first surface and a second surface opposite to the first surface, wherein the first semiconductor wafer has a first portion closer to the first surface and a second portion connected with the first portion and closer to the second surface, and the second portion is thicker than the first portion;

providing a second semiconductor wafer;

bonding the first semiconductor wafer and the second semiconductor wafer to form a stacked wafer structure;

performing an edge trimming process to the stacked wafer structure to form a trench penetrating through the second semiconductor wafer and extending beyond the first portion and extending into the second portion of the first semiconductor wafer;

bonding semiconductor dies to the second semiconductor wafer;

forming a filling material over the semiconductor dies and the first and second semiconductor wafers, wrapping around and filling between the semiconductor dies, covering the second semiconductor wafer, covering the first semiconductor wafer and partially filling the trench; and performing a wafer thinning process to remove the second portion of the first semiconductor wafer and partially remove the filling material in the trench, wherein a surface of the thinned first semiconductor wafer is levelled with a surface of the thinned filling material.

18. The trimming method according to claim 17, further comprising performing a thinning process to the second semiconductor wafer after bonding the first semiconductor wafer and the second semiconductor wafer and before bonding semiconductor dies to the second semiconductor wafer.

19. The trimming method according to claim 17, wherein the trench is formed by removing a peripheral portion of the stacked wafer structure.

20. The trimming method according to claim 17, wherein the filling material is formed with a main portion on the second semiconductor wafer, filling between the semiconductor dies and at least laterally wrapping the semiconductor dies, a drape portion extending over a sidewall of the trench, and an extension portion extending over a bottom surface of the trench.

* * * * *